United States Patent [19]
Kniffin

[11] Patent Number: 5,929,472
[45] Date of Patent: Jul. 27, 1999

[54] SEMICONDUCTOR FLOATING GATE SENSOR DEVICE

[75] Inventor: Margaret L. Kniffin, Tempe, Ariz.

[73] Assignee: Motorola, Inc., Schaumburg, Ill.

[21] Appl. No.: 08/834,965

[22] Filed: Apr. 7, 1997

[51] Int. Cl.[6] .................................................. H01L 29/84
[52] U.S. Cl. .......................... 257/254; 257/316; 257/415; 73/514.32; 73/754
[58] Field of Search .................................... 257/415, 417, 257/316, 254; 73/514.32, 724, 754; 438/52

[56] References Cited

U.S. PATENT DOCUMENTS

| | | | |
|---|---|---|---|
| 5,126,812 | 6/1992 | Greiff | 257/417 |
| 5,313,836 | 5/1994 | Fujii et al. | 73/514.16 |
| 5,417,111 | 5/1995 | Sherman et al. | 73/514.32 |
| 5,504,356 | 4/1996 | Takeuchi et al. | 257/254 |

FOREIGN PATENT DOCUMENTS

| | | |
|---|---|---|
| 0194953 | 2/1986 | European Pat. Off. . |
| 0671629 | 3/1995 | European Pat. Off. . |
| 4333875A1 | 4/1995 | Germany . |
| 4333875C2 | 8/1995 | Germany . |
| 60-053627 | 3/1985 | Japan . |
| 64-5075 | 1/1989 | Japan . |

OTHER PUBLICATIONS

"The Resonant Gate Transistor", Harvey C. Nathanson, William E. Newell, Robert A. Wickstrom, and John Ransford Davis, Jr.; *Transactions on Electronic Devices,* Vol. Ed 14, No. 3, Mar. 1967; pp. 117–133.

"The capacitively Controlled Field Effect Transistor (CCFET) As a New Low Power Gas Sensor", Zendo Gergintschew, Peter Kornetzky, Dagmar Schipanski; Elsevier Science S.A., ; Sensors and Actuators B 35–36 (1996) 285–289.

*Primary Examiner*—John Guay
*Attorney, Agent, or Firm*—Kenneth M. Seddon

[57] ABSTRACT

A sensor device (40) is formed in a semiconductor substrate (41). The sensor device (40) includes a microstructure (60) that is free to move in response to a force. The microstructure (60) is overlying a floating gate structure (51) and a channel region (44). A guard ring (52) is formed around the floating gate structure (51) to retard the migration of charge onto the floating gate structure (51). This in turn stabilizes the operational performance of the sensor device (40) over time.

15 Claims, 3 Drawing Sheets

SEMICONDUCTOR FLOATING GATE SENSOR DEVICE

BACKGROUND OF THE INVENTION

The present invention relates, in general, to semiconductor devices, and more particularly, to semiconductor devices that are responsive to and sense acceleration forces.

FIG. 1 is an enlarged cross-sectional view of a previously known, uncapped sensor device 10. Sensor device 10 includes a source region 12 and a drain region 13, which are separated by a channel region 15. Channel region 15 is covered with a layer of dielectric material 16 such as silicon dioxide. Sensor device 10 also includes a microstructure 17 that is free to move in response to an acceleration force applied to sensor device 10. Microstructure 17 moves across an airgap 27 in response to an acceleration force and this motion is indicated in FIG. 1 with an arrow 18.

To operate sensor device 10, a voltage potential is placed on microstructure 17, semiconductor substrate 11, source region 12, and on drain region 13 to generate a current flow across channel region 15. This current flow is indicated in FIG. 1 with an arrow 14. When an acceleration or de-acceleration force is applied to sensor device 10, the force causes microstructure 17 to move. This in turn, either increases or decreases the current flow (arrow 14) between source region 12 and drain region 13 a proportional amount.

One problem common to most conventional, uncapped sensor devices is that both their sensitivity to motion and their quiescent drain current tends to vary over time. For example, FIG. 2 is a graph 20 that is provided to illustrate how the current output of sensor device 10 varies over time. A line 23 represents the source-drain current (FIG. 1, arrow 14) along a y-axis 22 in micro-amps ($\mu$A) as a function of time along an x-axis 21 in seconds. As shown, the actual source-drain current of conventional uncapped devices initially increases rapidly during operation. This variability in output current makes the performance of a conventional sensor device unpredictable over time.

Up to now, the source of this variability in the performance of conventional sensor devices has not been understood. However, the impact of the variability of source-drain current in sensor devices is significant as it requires complicated and expensive circuitry to compensate for this problem. Accordingly, a need exists to first identify the cause of the variability in the performance associated with conventional sensor devices and then to provide a sensor device that does not suffer from this variability.

Figure 1:
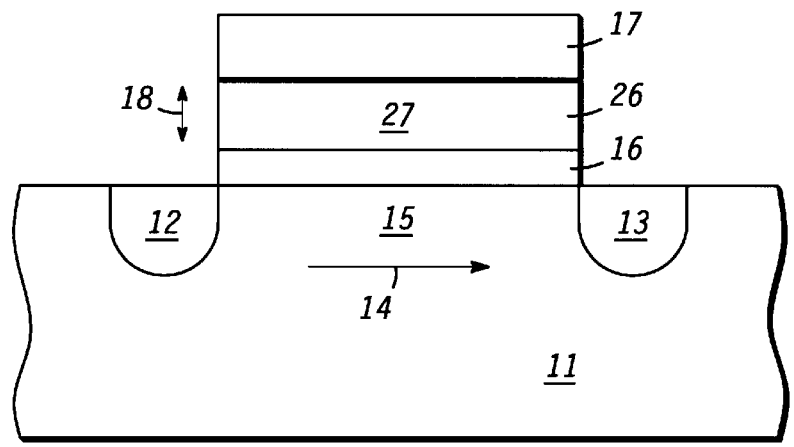
FIG. 1 is an enlarged cross-sectional view of a conventional sensor device.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

Figure 3:
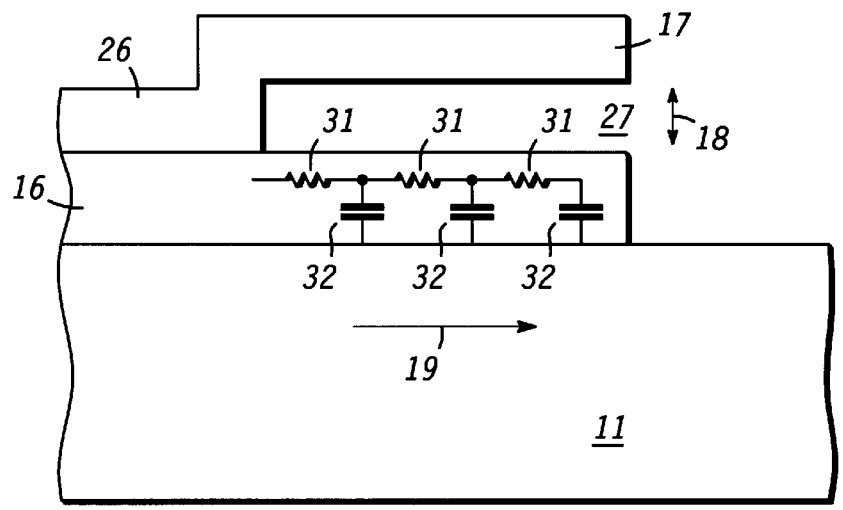
FIG. 3 is another enlarged cross-sectional view of the conventional sensor device that includes a superimposed schematic of an electrically equivalent modeling circuit.

FIG. 3 is an enlarged cross-sectional side view of sensor device 10 and is provided to illustrate how the cause of the variability in source-drain current was discovered. As shown, microstructure 17 is formed such that it is supported by an anchor region 26. Anchor region 26 is also used to place the necessary voltage potentials on microstructure 17 when sensor device 10 is in operation. To electrically isolate these voltage potentials from semiconductor substrate 11, anchor region 26 is typically formed on dielectric layer 16. This was a generally accepted way of electrically isolating microstructure 17 from channel region 15 (see FIG. 1) since dielectric layer 16 is made from a non-conductive material such as silicon dioxide.

However, it has been discovered that it is the very use of dielectric layer 16 that leads to the variability in source-drain current (FIG. 1, arrow 14), and consequently, to the unpredictable performance of sensor device 10. Although silicon dioxide is commonly considered a non-conductive material, it can be modeled for simulation purposes as a sequence of resistors 31 and capacitors 32 as shown in FIG. 3. When a voltage potential is placed on microstructure 17 via anchor region 26, there is a current flow across the surface of dielectric layer 16 through resistors 31, which in turn charges capacitors 32. This current flow is the result of surface charge migration across dielectric layer 16 and is indicated in FIG. 3 with an arrow 19. Resistors 31 represent the surface resistance that is seen by the charge as it migrates over the surface of dielectric layer 16.

Over time, capacitors 32 become charged and reduce the difference in voltage potential between microstructure 17 and the surface of dielectric layer 16. As a consequence, there is a reduced electric field across air gap 27 (see FIG. 1), and sensor device 10 is not as sensitive or responsive to motion of microstructure 17. The actual degradation in the performance of any one particular sensor device depends in part on the thickness and composition of the material used to form dielectric layer 16.

Now that the source of the variation in the performance of sensor devices has been identified, a structure and a method of making the same is provided. It should be understood that the present invention is not limited to sensor devices that have a moveable microstructure that modulates an underlying channel region. The present invention can also have application to sensor devices that employ capacitively coupled plates to sense acceleration forces, to sensors made from a chemically sensitive material such as tin oxide, or to other sensor structures.

Figure 4:
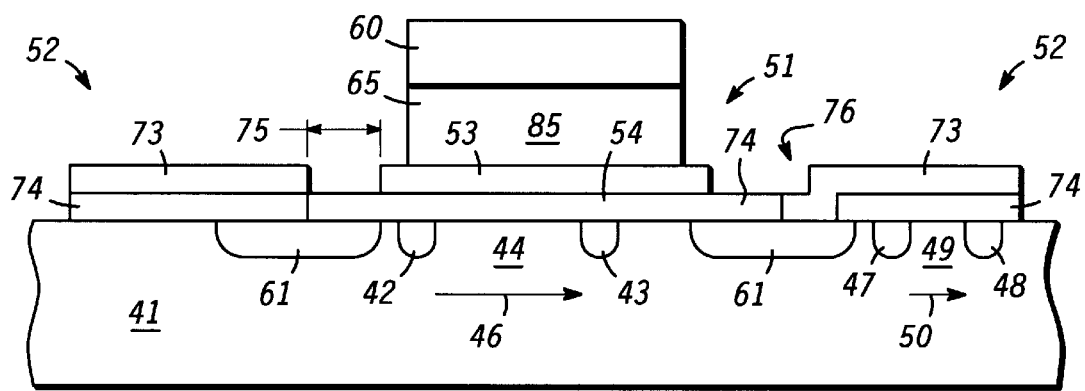
FIG. 4 is an enlarged cross-sectional view of a sensor device formed in accordance with the present invention.

FIG. 4 is an enlarged cross-sectional view of a sensor device 40, which is a semiconductor device such as an accelerometer that is formed in accordance with the present invention. Sensor device 40 has a microstructure 60 that is connected to a semiconductor substrate 41 by an anchor region 65 and is free to move in response to an acceleration force applied to sensor device 40 across and airgap 85. Microstructure 60 is a conductive plate that acts as a moveable gate that modulates a channel region 44 between a source region 42 and a drain region 43. Source region 42 and drain region 43 can be either of an n-type or p-type conductivity. Semiconductor substrate 41 is preferably made from silicon, but semiconductor substrate 41 could be made from another semiconductor material such as gallium arsenide, silicon carbide, or the like.

Sensor device 40 also has a guard ring 52 that is formed surrounding a floating gate structure 51. Floating gate structure 51 includes a layer of dielectric material 54 and a layer of conductive material 53. Dielectric layer 54 can be a layer of silicon dioxide, a layer of silicon nitride, or a stack of silicon dioxide and silicon nitride layers that is about 200 angstroms (Å) to 2000 Å thick. Conductive layer 53 is preferably a layer of polysilicon that is either doped or undoped, but conductive layer 53 could also be a layer of amorphous silicon, silicide, or a metal such as aluminum, nickel, or the like that is about 500 Å to 5000 Å thick.

Floating gate structure 51 is formed such that it is overlying at least channel region 44 and could be patterned so that it covers source region 42 and drain region 43 as shown in FIG. 4. Floating gate structure 51 is electrically "floating" in that conductive layer 53 is physically isolated from semiconductor substrate 41 and from overlying microstructure 60. The physical isolation from microstructure 60 helps eliminate some of the variability in performance that is common to conventional sensor devices (see above), but the physical isolation does not eliminate the variability entirely. Although floating gate structure 51 is electrically isolated from neighboring structures, there will be a voltage potential on conductive layer 53 due to capacitive coupling. This results in a current flow across channel region 44. This current flow is indicated in FIG. 4 with an arrow 46.

Changes in the position of microstructure 60 relative to conductive layer 53 due to an acceleration force modifies the capacitive coupling between microstructure 60 and conductive layer 53. This change in position changes the voltage potential on conductive layer 53 of floating gate structure 51. The change in voltage potential results in a change in the source-drain current (arrow 46), which is used to indicate that an acceleration force has been sensed.

The voltage potential on conductive layer 53 when microstructure 60 is static may drift over time due to surface charge migration from neighboring structures such as anchor region 65. To address this problem, guard ring 52 is formed to encompass or encircle floating gate structure 51. As shown in FIG. 4, guard ring 52 is made up of a dielectric layer 74 and a conductive layer 73. Dielectric layer 74 can be a layer of silicon dioxide or silicon nitride, and conductive layer 73 can be a layer of polysilicon or metal. In the preferred embodiment, guard ring 52 and floating gate structure 51 are formed simultaneously from the same deposition and patterning steps. In other words, dielectric layer 74 and conductive layer 73 would be made from the same materials used to form dielectric layer 54 and conductive layer 53, respectively, and have a comparable thickness.

Guard ring 52 is formed such that the conductive portion of guard ring 52 (i.e., conductive layer 73) is physically separated from the conductive portion of floating gate structure 51 (i.e., conductive layer 53) by a distance indicated in FIG. 4 with an arrow 75. This distance can vary depending upon many variables including the relative size of floating gate structure 51, the operational voltages of sensor device 40, and a particular customer's tolerance to variations in the source-drain current of sensor device 40. Preferably, this distance (arrow 75) ranges from about 0.5 microns to 50 microns.

Guard ring 52 may also include a reference source region 47 and a reference drain region 48 in semiconductor substrate 41 that are separated from each other to provide a reference channel region 49. Preferably, dielectric layer 74 covers at least reference channel region 49, and reference channel region 49 has a length that is equal to the length of channel region 44. When sensor device 40 is in operation, a voltage potential that is close to the voltage potential on conductive layer 53 is placed on guard ring 52 to minimize the performance variation due to charge migration across dielectric layer 54 to floating gate structure 51.

The optimal voltage potential is determined by adjusting the voltage potential on guard ring 52 until the current flowing through reference channel region 49, indicated in FIG. 4 with an arrow 50, is essentially equal to the current flowing through channel region 44 (arrow 46). This is assuming of course that the voltage potential between drain region 43 and source region 42 is approximately equal to the voltage potential between reference drain region 48 and reference source region 47. This current matching or tuning process can be accomplished with external circuitry not shown in FIG. 4.

By placing a voltage potential on guard ring 52, the voltage potential on floating gate structure 51 can be stabilized so that it does not vary over time due to the migration of charge. Although the actual voltage potential on conductive layer 53 of floating gate structure 51 is unknown, the voltage potential on floating gate structure 51 will remain relatively stable due to the presence of the voltage potential on guard ring 52. This retards the flow parasitic charge onto floating gate structure 51 by reducing the potential difference between floating gate structure 51 and guard ring 52 so that electrical characteristics of floating gate structure 51 remain relatively constant over time. As a result, movement of microstructure 60 results in a repeatable change in the current flowing through channel region 44 (arrow 46). This current can then be used to calculate the amount of force applied sensor device 40.

Due to subtle process variations in the fabrication of sensor device 40, such as the quality and thickness of the material used to form dielectric layer 54 of floating gate structure 51, each individual sensor device formed in accordance with the present invention may require a different voltage potential on guard ring 52 to minimize the migration of charge. The technique described above allows the performance variations of each individual sensor device to be compensated by properly tuning the voltage potential on guard ring 52.

As mentioned above, the channel length of reference channel region 49 is preferably equal to the channel length of channel region 44. This is not intended as a limitation of the present invention as one skilled in the art will appreciate that this is intended to simplify the external circuitry used to set the voltage potential on guard ring 52. It should also be understood that the current flowing through reference channel region 49 (arrow 50) need not be exactly equal to the current flowing through channel region 44 (arrow 46) for a sensor device to benefit from the present invention. This is only the optimal condition to minimize the amount of performance variation of sensor device 40 and deviations from this optimal condition may result in a sensor device that has comparable performance consistency over time.

To further impede the migration of charge onto floating gate structure 51, a doped region 61 can be formed in semiconductor substrate 41 to enhance the electrical coupling of guard ring 52 to floating gate structure 51. Doped region 61 is formed in semiconductor substrate 41 using a conventional ion implantation process. Doped region can be either of an n-type conductivity or a p-type conductivity and preferably has a doping concentration of at least $1\times10^{15}$ atoms/centimeter$^3$.

As shown in FIG. 4, doped region 61 is preferably positioned such that a portion of both floating gate structure 51 and guard ring 52 are overlying doped region 61. Electrical contact between guard ring 52 and doped region 61 can be made in a variety of ways including the use of a contact region 76 as shown in FIG. 4. When a voltage potential is placed on guard ring 52 as described above, the same voltage potential will be on doped region 61. It should also be noted that doped region 61 does not contact conductive layer 53 of floating gate structure 51 as dielectric layer 54 provides electrical isolation between doped region 61 and conductive layer 53. One skilled in the art will appreciate that it may be necessary or desirable to form isolation structures such as a trench structure or a field isolation structure (not shown) to electrically isolate source region 42 and drain region 43 from doped region 61 or from reference source region 47 and reference drain region 48.

Figure 5:
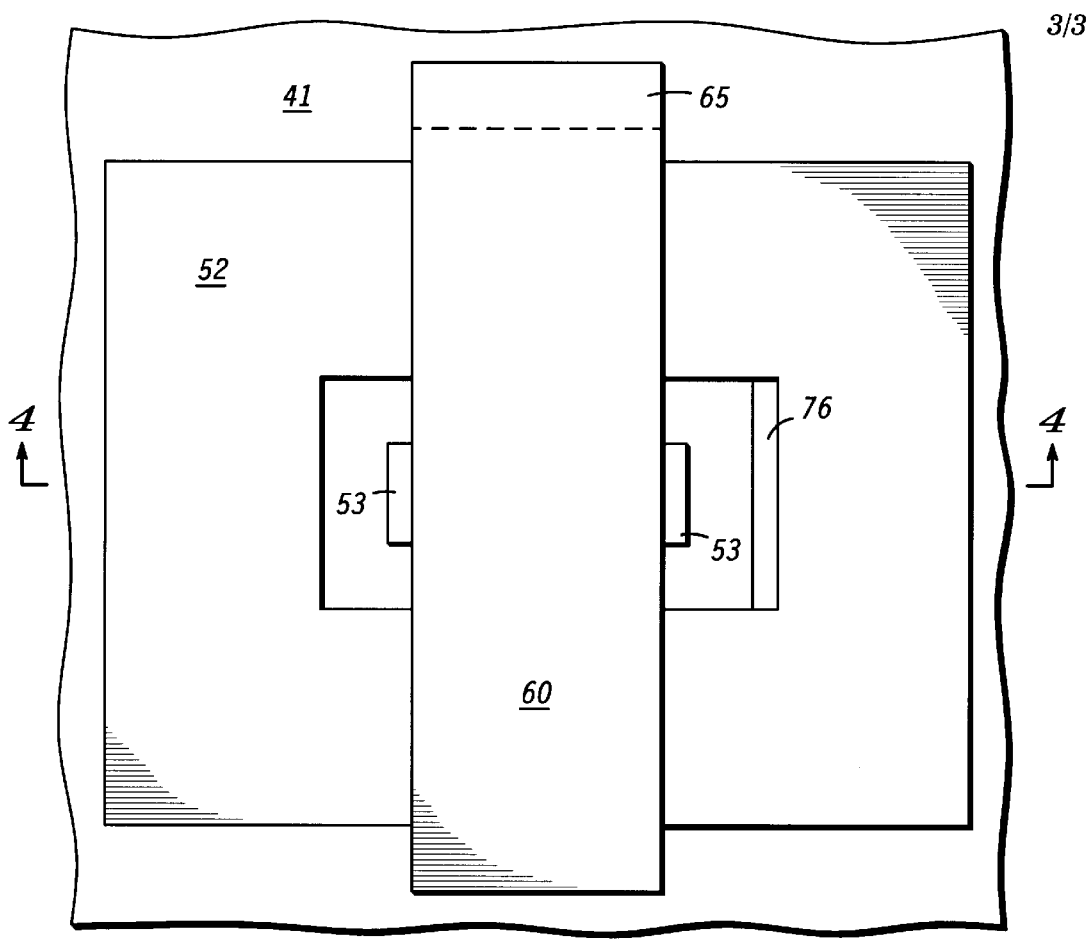
FIG. 5 is an enlarged top view of the sensor device formed in accordance with the present invention.

FIG. 5 is an enlarged top view of sensor device 40. Sectional lines 4—4 are used to indicate the location of the cross-section illustrated in FIG. 4. FIG. 5 is provided to show the relative position of microstructure 60 to guard ring 52 and floating gate structure 51 and to illustrate how guard ring 52 can surround floating gate structure 51. It should also be noted that microstructure 60 is narrower than floating gate structure 51. This is only one example of how microstructure 60 and floating gate structure 51 can be formed and is shown in this manner in FIGS. 4 and 5 for ease of understanding.

Figure 2:
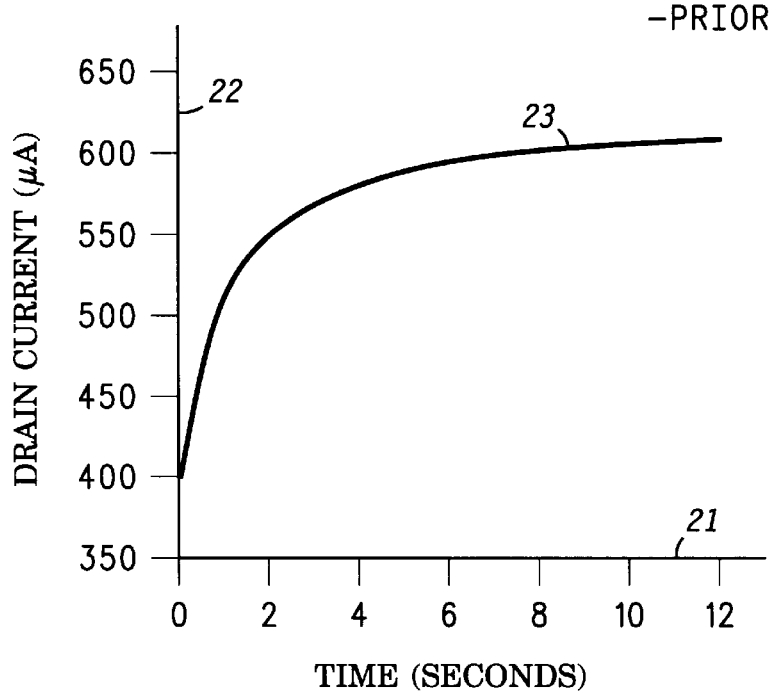
FIG. 2. is a graph illustrating the performance of the conventional sensor device.
Figure 6:
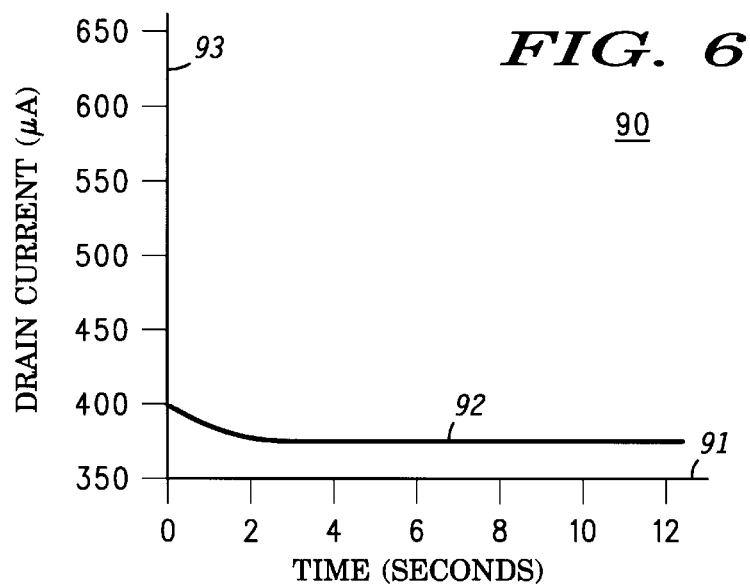
FIG. 6. is a graph illustrating the performance of the sensor device formed in accordance with the present invention.

FIG. 6 is a graph 90 that demonstrates the significant improvement in the variability of the performance of a sensor device when the sensor device is formed in accordance with the present invention. Graph 90 has a y-axis 93 that represents the quiescent source-drain current of a sensor device in $\mu A$ along an x-axis 91 in seconds. A line 92 is used to illustrate how the source-drain current of an uncapped sensor device formed in accordance with the present invention varies over time. Compared to the variability of a conventional uncapped sensor device (see FIG. 2), the performance of a sensor formed in accordance with the present invention is much more stable and predictable over time as the current-drain current is essentially the same after both 2 and 8 seconds of operation.

The source of the variability in the performance of conventional sensor devices has been discovered. Additionally, the present invention provides a method of forming a sensor device that retards the migration of charge onto structures that are under a moveable microstructure. Accordingly, the present invention provides a structure that allows for the sensing of an acceleration or de-acceleration force in a manner that is not as variable as that provided by a conventional sensor device.

I claim:

1. A semiconductor device comprising:
   a semiconductor substrate;
   a first doped region in the semiconductor substrate;
   a second doped region in the semiconductor substrate, wherein the second doped region is separated from the first doped region to provide a first channel region having a length;
   a gate structure overlying at least the first channel region;
   a guard ring overlying the semiconductor substrate and encompassing the gate structure; and
   a moveable conductive plate overlying at least a portion of the gate structure, wherein the moveable conductive plate is free to move in a direction with respect to the gate structure.

2. The semiconductor device of claim 1 further comprising a third doped region in the semiconductor substrate, wherein a portion of the gate structure and a portion of the guard ring are overlying the third doped region.

3. The semiconductor device of claim 1 further comprising a third doped region and a fourth doped region that in the semiconductor substrate, wherein the third doped region is separated from the fourth doped region to provide a second channel region and a portion of the guard ring is overlying the second channel region.

4. The semiconductor device of claim 3 wherein the second channel region has a length that is essentially equal to the length of the first channel region.

5. The semiconductor device of claim 3 further comprising a fifth doped region in the semiconductor substrate, wherein a portion of the gate structure and a portion of the guard ring are overlying the fifth doped region.

6. The semiconductor device of claim 3 wherein the gate structure is electrically floating and there is a first current flow between the first doped region and the second doped region and when a first voltage potential is placed on the guard ring, a second current flow passes from the third doped region to the fourth doped region that is essentially equal to the first current flow.

7. The semiconductor device of claim 6 wherein the first current flow increases when a second voltage potential is placed on the moveable conductive plate and the moveable conductive plate moves as a result of an acceleration force.

8. The semiconductor device of claim 7 wherein the gate structure comprises a layer of conductive material overlying a layer of dielectric material, and the layer of dielectric material comprises silicon nitride.

9. The semiconductor device of claim 8 wherein the layer of conductive material comprises polysilicon and is electrically isolated from the semiconductor substrate.

10. A sensor device comprising:
    a semiconductor substrate;
    a first doped region in the semiconductor substrate;
    a second doped region in the semiconductor substrate, wherein the second doped region is separated from the first doped region to provide a first channel region having a length;
    a first conductive plate overlying at least the first channel region;
    a second conductive plate overlying the first channel region and the first conductive plate, wherein the second conductive plate is moveable; and
    a guard ring overlying the semiconductor substrate and encircling the first conductive plate.

11. The sensor device of claim 10 further comprising a third doped region and a fourth doped region in the semiconductor substrate, wherein the third doped region is separated from the fourth doped region to provide a second channel region and a portion of the guard ring is overlying the second channel region.

12. The sensor device of claim 11 wherein the second channel region has a length that is essentially equal to the length of the first channel region.

13. The sensor device of claim 11 further comprising a fifth doped region in the semiconductor substrate, wherein a portion of the first conductive plate and a portion of the guard ring are overlying the fifth doped region.

14. The sensor device of claim 11 wherein there is a first current flow between the first doped region and the second doped region and when a voltage potential is placed on the guard ring, a second current flow passes from the third doped region to the fourth doped region that is essentially equal to the first current flow.

15. The sensor device of claim 10 wherein the sensor device is an accelerometer.